United States Patent
Ohashi et al.

(10) Patent No.: US 10,533,250 B2
(45) Date of Patent: Jan. 14, 2020

(54) METHOD OF MANUFACTURING SEMICONDUCTOR DEVICE

(71) Applicant: HITACHI KOKUSAI ELECTRIC INC., Tokyo (JP)

(72) Inventors: Naofumi Ohashi, Toyama (JP); Shun Matsui, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 15/927,476

(22) Filed: Mar. 21, 2018

(65) Prior Publication Data

US 2019/0242015 A1 Aug. 8, 2019

(30) Foreign Application Priority Data

Feb. 8, 2018 (JP) .................. 2018-021125

(51) Int. Cl.
*C23C 16/44* (2006.01)
*H01L 21/02* (2006.01)
*C23C 16/455* (2006.01)

(52) U.S. Cl.
CPC ...... *C23C 16/4408* (2013.01); *H01L 21/0217* (2013.01); *H01L 21/0228* (2013.01); *C23C 16/45525* (2013.01)

(58) Field of Classification Search
CPC ................................ C23C 16/4408
See application file for complete search history.

(56) References Cited

U.S. PATENT DOCUMENTS 7,582,571 B2  9/2009 Takeyama et al.
9,502,239 B2  11/2016 Okuno et al.
(Continued)

FOREIGN PATENT DOCUMENTS

CN  101147245 A  3/2008
JP  2004-207713 A  7/2004
(Continued)

OTHER PUBLICATIONS

Taiwanese Office Action dated Nov. 29, 2018 for the Taiwanese Patent Application No. 107109684.
Korean Office Action dated Sep. 16, 2019 for the Korean Patent Application No. 10-2018-0031794.

*Primary Examiner* — Elizabeth A Burkhart
(74) *Attorney, Agent, or Firm* — Volpe and Koenig, P.C.

(57) ABSTRACT

Described herein is a technique capable of improving a quality of a film formed on a substrate. According to the technique described herein, there is provided a method of manufacturing a semiconductor device, including: (a) exhausting an inner atmosphere of a first gas supply pipe configured to supply a first gas generated by a vaporizer to a process chamber accommodating a substrate by a first gas discharge system connected to the first gas supply pipe; (b) exhausting an inner atmosphere of the vaporizer through a second gas discharge system provided at a vaporizer outlet pipe of the vaporizer by supplying an inert gas to the vaporizer via a vaporizer inlet pipe of the vaporizer; and (c) supplying the first gas generated by the vaporizer to the process chamber accommodating the substrate via the vaporizer outlet pipe, the first gas supply pipe and a first timing valve provided at the first gas supply pipe before (a) is performed or after (b) is performed.

15 Claims, 7 Drawing Sheets

(56) References Cited

U.S. PATENT DOCUMENTS

| | | | |
|---|---|---|---|
| 2006/0032444 A1 | 2/2006 | Hara | |
| 2007/0079760 A1* | 4/2007 | Okabe | C23C 16/4486 118/715 |
| 2008/0132069 A1* | 6/2008 | Lee | C23C 16/405 438/680 |
| 2011/0033956 A1 | 2/2011 | Sakai | |
| 2014/0290577 A1 | 10/2014 | Nakajima et al. | |
| 2015/0152557 A1 | 6/2015 | Okura et al. | |
| 2016/0090651 A1* | 3/2016 | Ashihara | C23C 16/52 118/712 |
| 2016/0115594 A1* | 4/2016 | Moroi | C23C 16/45561 118/728 |
| 2016/0201193 A1* | 7/2016 | Saido | C23C 16/455 118/715 |
| 2017/0287716 A1 | 10/2017 | Kaga | |

FOREIGN PATENT DOCUMENTS

| | | |
|---|---|---|
| JP | 2006-052424 A | 2/2006 |
| JP | 2010-111889 A | 5/2010 |
| JP | 2011-054938 A | 3/2011 |
| JP | 2012-172171 A | 9/2012 |
| JP | 2014-012869 A | 1/2014 |
| JP | 2014-194964 A | 10/2014 |
| JP | 2016-084517 A | 5/2016 |
| TW | 201513226 A | 4/2015 |
| WO | 2016098183 A1 | 6/2016 |

* cited by examiner

METHOD OF MANUFACTURING SEMICONDUCTOR DEVICE

CROSS-REFERENCE TO RELATED PATENT APPLICATION

This non-provisional U.S. patent application claims priority under 35 U.S.C. § 119 of Japanese Patent Application No. 2018-021125, filed on Feb. 8, 2018, the entire contents of which are hereby incorporated by reference.

BACKGROUND

1. Field

The present disclosure relates to a method of manufacturing a semiconductor device.

2. Description of the Related Art

As one of manufacturing processes of a semiconductor device, a film-forming process for forming a film on a substrate using a liquid source or a solid source is performed.

It is required that a quality of the film formed on the substrate is improved.

SUMMARY

Described herein is a technique capable of improving the quality of the film formed on the substrate.

According to one aspect of the technique described herein, there is provided a method of manufacturing a semiconductor device, including: (a) exhausting an inner atmosphere of a first gas supply pipe configured to supply a first gas generated by a vaporizer to a process chamber accommodating a substrate by a first gas discharge system connected to the first gas supply pipe; (b) exhausting an inner atmosphere of the vaporizer through a second gas discharge system provided at a vaporizer outlet pipe of the vaporizer by supplying an inert gas to the vaporizer via a vaporizer inlet pipe of the vaporizer; and (c) supplying the first gas generated by the vaporizer to the process chamber accommodating the substrate via the vaporizer outlet pipe, the first gas supply pipe and a first timing valve provided at the first gas supply pipe before (a) is performed or after (b) is performed.

DETAILED DESCRIPTION

Hereinafter, embodiments will be described.

<Embodiment>

An embodiment will be described with reference to FIGS. 1 through 7.

(1) Configuration of Substrate Processing Apparatus

First, a substrate processing apparatus 200 preferably used in the embodiment will be described.

Figure 1:
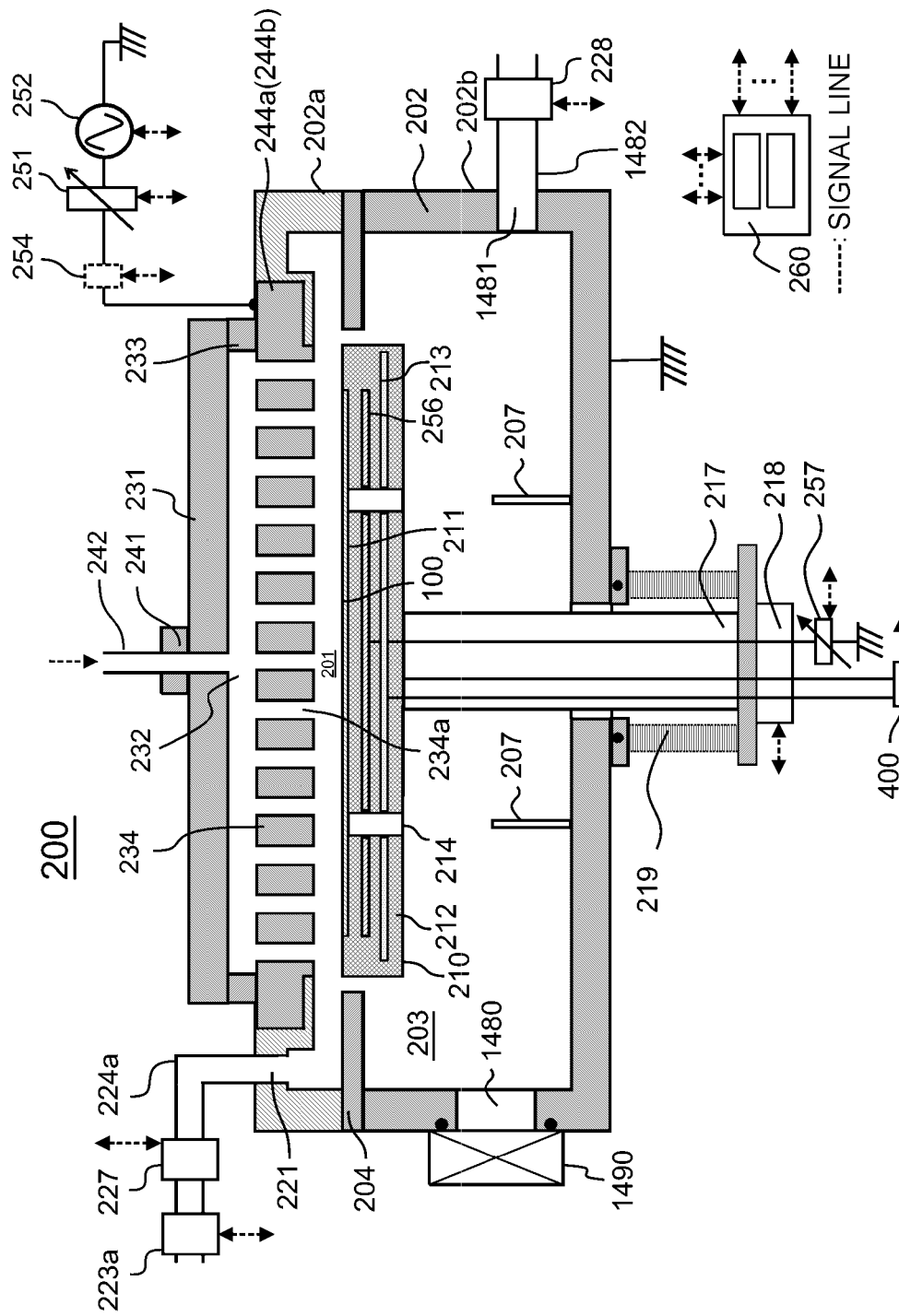
FIG. 1 schematically illustrates a vertical cross-section of a substrate processing apparatus preferably used in an embodiment described herein.

The substrate processing apparatus 200 may include an insulating film forming apparatus. As shown in FIG. 1, the substrate processing apparatus 200 includes, for example, a single wafer type substrate processing apparatus.

As shown in FIG. 1, the substrate processing apparatus 200 includes a process vessel 202. For example, the process vessel 202 is a flat and sealed vessel having a circular horizontal cross-section. The process vessel 202 is made of a metal such as aluminum (Al) and stainless steel (SUS) or quartz. A process space (process chamber) 201 where a substrate 100 such as a silicon wafer is processed and a transfer space (transfer chamber) 203 are provided in the process vessel 202. The process vessel 202 includes an upper vessel 202a and a lower vessel 202b. A partition plate 204 is provided between the upper vessel 202a and the lower vessel 202b. The space above the partition plate 204 surrounded by the upper vessel 202a is referred to as the process chamber 201. The space under the partition plate 204 is referred to as the transfer chamber 203.

A substrate loading/unloading port 1480 is provided at a side wall of the lower vessel 202b adjacent to a gate valve 1490. The substrate 100 is moved between a vacuum transfer chamber (not shown) and the transfer chamber 203 through the substrate loading/unloading port 1480. Lift pins 207 are provided at the bottom of the lower vessel 202b. The lower vessel 202b is electrically grounded.

A substrate support 210 is provided in the process vessel 202 to support the substrate 100. The substrate support 210 includes a substrate support member 212 having a substrate placing surface 211 on which the substrate 100 is placed and a heater (heating mechanism) 213 embedded in the substrate support member 212. Holes 214 wherethrough the lift pins 207 penetrate are provided in the substrate support 210 at positions corresponding to the lift pins 207. The heater 213 is electrically connected to a temperature controller 400 capable of adjusting a temperature of the heater 213. A bias electrode 256 for applying a bias to the substrate 100 or the process chamber 201 may be provided in the substrate support member 212. The bias electrode 256 is electrically connected to a bias controller 257 capable of adjusting the bias.

The substrate support member 212 is supported by a shaft 217. The shaft 217 penetrates the bottom of the process vessel 202 and is connected to an elevating mechanism 218 at the outside of the process vessel 202. The substrate 100 placed on the substrate placing surface 211 is elevated and lowered by operating the elevating mechanism 218 by elevating and lowering the shaft 217 and the substrate support 210. A bellows 219 covers the lower end portion of the shaft 217 to maintain the inside of the process chamber 201 airtight.

When the substrate 100 is transported, the substrate support 210 is lowered until a wafer transfer position is reached. When the substrate 100 is processed, the substrate support 210 is elevated until a wafer processing position shown FIG. 1 is reached. When the substrate support 210 is at the wafer transfer position, the upper ends of the lift pins 207 protrude from the substrate placing surface 211.

Specifically, when the substrate support 210 is lowered to the wafer transfer position, the upper ends of the lift pins 207 protrude from the upper surface of the substrate placing surface 211, and the lift pins 207 support the substrate 100 from thereunder. When the substrate support 210 is elevated to the wafer processing position, the lift pins 207 are retracted from the upper surface of the substrate placing surface 211 and the substrate placing surface 211 supports the substrate 100 from thereunder. Preferably, the lift pins 207 are made of a material such as quartz and alumina since the lift pins 207 are in direct contact with the substrate 100.

<Exhaust System>

A first exhaust port 221, which is a part of a first exhaust system for exhausting an inner atmosphere of the process chamber 201, is connected to the inner surface of the process chamber 201 (the upper vessel 202a). A first exhaust pipe 224a is connected to the first exhaust port 221. A pressure controller 227 such as an APC (Automatic Pressure Controller) for adjusting the inner pressure of the process chamber 201 to a predetermined pressure, a first vacuum pump 223a and a second vacuum pump 223b, which will be described later, are connected to the first exhaust pipe 224a in-line. The first exhaust port 221, the first exhaust pipe 224a and the pressure controller 227 constitute the first exhaust system (first exhaust line). The first exhaust system may further include the first vacuum pump 223a A second exhaust port 1481 for exhausting an inner atmosphere of the transfer chamber 203 is connected to the surface of the inner wall of the transfer chamber 203. A second exhaust pipe 1482 is connected to the second exhaust port 1481. A pressure controller 228 is connected to the second exhaust pipe 1482. The inner atmosphere of the transfer chamber 203 may be exhausted through the second exhaust pipe 1482 by the pressure controller 228 until a predetermined pressure is reached. The inner atmosphere of the process chamber 201 may also be exhausted through the transfer chamber 203. The second exhaust port 1481, the second exhaust pipe 1482 and the pressure controller 228 constitute the second exhaust system (second exhaust line). The exhaust system is constituted by the first exhaust system and the second exhaust system.

<Gas Introduction Port>

A shower head 234 is provided at the upper portion of the process chamber 201. A gas introduction port 241 for supplying various gases into the process chamber 201 is provided at an upper surface (ceiling) of the shower head 234. A detailed configuration of each gas supply system connected to the gas introduction port 241 will be described later.

<Gas Dispersion Mechanism)

The shower head 234, which is a gas dispersion mechanism, includes a buffer chamber 232 and a dispersion plate 244a. A first electrode 244b which is a part of an activation mechanism described later may be provided at the dispersion plate 244a. Holes 234a for dispersing and supplying a gas to the substrate 100 is provided at the dispersion plate 244a. The shower head 234 is provided between the gas introduction port 241 and the process chamber 201. A gas supplied through the gas introduction port 241 is supplied to the buffer chamber 232 of the shower head 234 and is then supplied to the process chamber 201 via the holes 234a.

The first electrode 244b provided in the dispersion plate 244a may be made of a conductive metal. The first electrode 244b is a part of the activation mechanism (also referred to as "excitation mechanism" or "plasma generator") for exciting the gas. An electromagnetic wave (high frequency power or microwave) may be applied to the first electrode 244b.

When a cover 231 is made of a conductive material, an insulating block 233 is provided between the cover 231 and the first electrode 244b. The insulating block 233 electrically insulates the cover 231 from the first electrode 244b.

<Activation Mechanism (Plasma Generator)>

The activation mechanism will be described. A matching mechanism 251 and a high frequency power supply 252, which are a part of the activation mechanism, are connected to the first electrode 244b provided in the dispersion plate 244a. The matching mechanism 251 and the high frequency power supply 252 are configured to supply an electromagnetic wave (high frequency power or microwave) to the first electrode 244b. When the electromagnetic wave is supplied to the first electrode 244b, the gas supplied into the process chamber 201 is activated. The first electrode 244b is capable of generating capacitively coupled plasma. Specifically, the first electrode 244b is a conductive plate supported by the upper vessel 202a. The activation mechanism is constituted by at least the first electrode 244b, the matching mechanism 251 and the high frequency power supply 252. An impedance meter 254 may be provided between the first electrode 244b and the high frequency power supply 252. The matching mechanism 251 and the high frequency power supply 252 may be feedback-controlled based on the measured impedance by the impedance meter 254. The high frequency power supply 252 may transmit or receive power control data to or from a controller 260. The matching mechanism 251 may transmit or receive matching control data including data representing traveling wave and reflected wave to or from the controller 260. The impedance meter 254 may transmit or receive impedance control data to or from the controller 260.

<Gas Supply System>

A common gas supply pipe 242 is connected to the gas introduction port 241. Various gases are supplied into the shower head 234 through the common gas supply pipe 242 and the gas introduction port 241.

Figure 2:
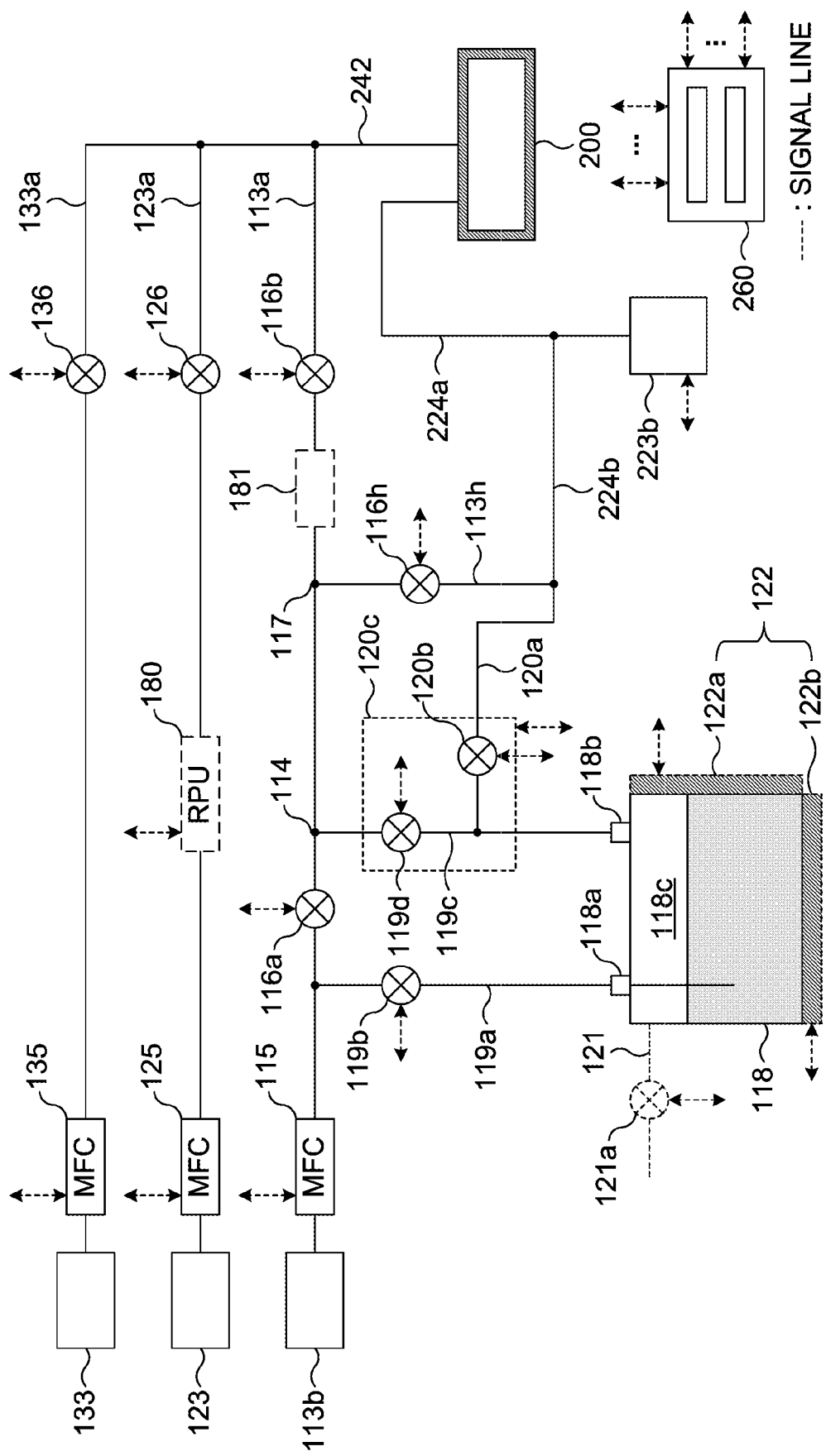
FIG. 2 schematically illustrates a gas supply system of the substrate processing apparatus preferably used in the embodiment.

As shown in FIG. 2, gas supply pipes are connected to the common gas supply pipe 242. Specifically, a first gas supply pipe 113a, a second gas supply pipe 123a and a third gas supply pipe 133a are connected to the common gas supply pipe 242.

A first element-containing gas (also referred to as "first process gas" or "first gas") is supplied by a first gas supply system which includes the first gas supply pipe 113a. A second element-containing gas (also referred to as "second process gas" or "second gas") is supplied by a second gas supply system which includes the second gas supply pipe 123a. A third element-containing gas (also referred to as "third gas") is supplied by a third gas supply system (also referred to as "inert gas supply system") which includes the third gas supply pipe 133a.

<First Gas Supply System>

An inert gas supply source 113b, a mass flow controller (MFC) 115 serving as a flow rate controller (flow rate control mechanism) and valves 116a and 116b serving as opening/closing valves are provided at the first gas supply pipe 113a in order from an upstream side to a downstream side of the first gas supply pipe 113a. The valve 116a may also be referred to as "purge valve" for purging the first gas supply pipe 113a. The valve 116b may also be referred to as "first timing valve 116b" for controlling the timing of the supply of the gas onto the substrate 100.

A vaporizer inlet pipe 119a is connected to the first gas supply pipe 113a between the MFC 115 and the valve 116a (also referred to as "purge valve"). The vaporizer inlet pipe 119a connects the first gas supply pipe 113a to an inlet port 118a of a vaporizer 118. An inlet valve 119b is provided at the vaporizer inlet pipe 119a.

A vaporizer outlet pipe 119c is connected to the first gas supply pipe 113a at a confluent portion (also referred to as "connecting point" or "connecting part") 114 provided at one side of the purge valve 116a between the purge valve 116a and the first timing valve 116b. The vaporizer outlet pipe 119c connects the first gas supply pipe 113a to an outlet port 118b of the vaporizer 118. An outlet valve 119d is provided at the vaporizer outlet pipe 119c.

The controller 260, which will be described later, is capable of controlling the opening/closing operations of the above-described valves such that an inert gas from the inert gas supply source 113b is directly supplied to the common gas supply pipe 242 via the first gas supply pipe 113a, and to the vaporizer 118 via the vaporizer inlet pipe 119a. As the inert gas is supplied to the vaporizer 118, the first gas, which is from vaporizing the source in the vaporizer 118, is supplied from the vaporizer 118 into the first gas supply pipe 113a via the vaporizer outlet pipe 119c. If the source in the vaporizer 118 can be vaporized into the first gas without supplying the inert gas and be supplied into the first gas supply pipe 113a, it is not necessary to supply the inert gas to the vaporizer 118.

According to the embodiment, the first element-containing gas (first gas) is one of process gases. The first element-containing gas may include a group 14 element such as silicon, i.e. is a silicon-containing gas. Specifically, the first element-containing gas may include bis diethylamino silane ($Si[N(C_2H_5)_2]_2H_2$, abbreviated to as BDEAS) gas. The source of the first gas is stored in the vaporizer 118. When the source or the first gas contains at least one of amino group (NH—) and carbon (C), the characteristics of the film formed on the substrate 100 can be improved. For example, the uniformity of the thickness and the electrical characteristics of the film are improved. However, the sources or the first gas containing at least one of amino groups and carbon has lower thermal stability than sources free of amino groups and carbon. For example, a source containing at least one of amino group and carbon may be thermally decomposed when heated to a temperature higher than the boiling point.

The first element-containing gas from the vaporizer 118 is supplied to the substrate processing apparatus 200 via the outlet valve 119d, the first timing valve 116b, the first gas supply pipe 113a and the common gas supply pipe 242.

The first gas supply system is constituted by the vaporizer 118, the vaporizer outlet pipe 119c, the outlet valve 119d and the first, gas supply pipe 113a.

A gas tank 181 may be provided at the upstream side of the valve 116b at the first gas supply pipe 113a. When the first gas is stored in the gas tank 181, a large amount of the first gas may be supplied to the substrate 100. The first gas supply system may further include the gas tank 181.

The first gas supply system may further include the inert gas supply source 113b. The inert gas supply source 113b is capable of supplying the inert gas to the first gas supply pipe 113a, the vaporizer inlet pipe 119a or both. The inert gas supply source 113b may be installed in the semiconductor device manufacturing factory.

A source supply pipe 121 for supplying a source to the vaporizer 118 may be connected to the vaporizer 118. A valve 121a may be provided at the source supply pipe 121. The valve 121a is capable of adjusting an amount of the source supplied to the source supply pipe 121.

A remaining amount detector 122 capable of detecting the amount of the source remaining in the vaporizer 118 may be provided in the vaporizer 118. The remaining amount detector includes a level meter 122a and/or a weight meter 122b, which are denoted by dashed line in FIG. 2. The level meter 122a is capable of detecting the level of the liquid source, and the weight meter 122b is capable of detecting the weight of the source. The remaining amount detector enables the detection of the amount of the source remaining in the vaporizer 118. The amount of source remaining in the vaporizer 118 may be calculated based on the accumulated amount of flow rate controlled by the MFC 115, the accumulated time duration of the valves such as inlet valve 119b, outlet valve 119d and valve 116b in open state, the accumulated time duration of a first gas supply step S503. For example, the amount of the source remaining in the vaporizer 118 can be indirectly calculated by the controller 260 executing the calculation program based on the accumulated amounts exemplified above. When the amount of the source remaining in the vaporizer 118 is calculated by the calculation program, the remaining amount detector is embodied by the calculation program, and the remaining amount detector 122 shown in FIG. 2 may not be necessary. However, the amount of the remaining source may be calculated by both the accumulated amounts exemplified above and the actual hardware remaining amount detector 122 in FIG. 2.

Referring to FIG. 2, a first gas generated by a natural evaporation of a source stored in the vaporizer 118, a first gas remaining from a prior substrate processing and components from a decomposition of the source or the first gas (referred to hereinafter as "natural first gas, etc.") are present in a space 118c of the vaporizer 118. The natural first gas, etc. may also be present in parts such as the vaporizer outlet pipe 119c and the first gas supply pipe 113a. The natural first gas, etc. is generated, for example, when the substrate processing apparatus 200 is not in operation or when the substrate processing apparatus 200 is idle. Moreover, the natural first gas, etc. may be generated in steps such as a substrate loading step S501, a temperature elevating step S502, a film-forming step S302, a determination step S507, a pressure adjusting step S508 and a substrate unloading step S509, which will be described later. If the natural first gas, etc. are supplied to the substrate processing apparatus 200 at an undesired timing, the uniformity and quality of the substrate processing may be degraded. For example, the characteristics of the film (the quality of the film) formed when the natural first gas, etc. is supplied differs from those of the film when the natural first gas, etc. is not supplied.

The inventors of the present application have developed a technique for removing the natural first gas, etc. from the vaporizer 118, the first gas supply pipe 113a and the vaporizer outlet pipe 119c. For example, the natural first gas, etc. present in the vaporizer 118 or the vaporizer outlet pipe 119c may be discharged through a second exhaust pipe 224b using a second discharge pipe 120a, which will be described later in detail. The natural first gas, etc. present in the first gas supply pipe 113a may be discharged through the second exhaust pipe 224b using a first discharge pipe 113h, which will be also described later in detail.

In the following description, a bubbling type vaporizer 118 is exemplified. However, an evaporation type vaporizer or a sublimation type vaporizer may be also used. Any type of vaporizer may be used as long as the natural first gas, etc. is generated in the vaporizer.

In the following description, the source stored in the vaporizer 118 is a liquid. However, a solid source can be used as long as the natural first gas, etc. is generated in the vaporizer.

<Gas Discharge System>

A gas discharge system is constituted by a first gas discharge system, a second gas discharge system or both. Hereinafter, configurations of the first gas discharge system and the second gas discharge system will be described.

<First Gas Discharge System>

The first discharge pipe 113*h* is connected to the first gas supply pipe 113*a* at a confluent portion 117 provided at one side of the first timing valve 116*b* between the purge valve 116*a* and the first timing valve 116*b*. The first discharge pipe 113*h* connects the first gas supply pipe 113*a* to the second exhaust pipe 224*b*. A first discharge valve 116*h* is provided at the first discharge pipe 113*h*. The first gas discharge system is constituted by the first discharge pipe 113*h* and the first discharge valve 116*h*.

<Second Gas Discharge System>

The second discharge pipe 120*a* is connected to the vaporizer outlet pipe 119*c* between the outlet valve 119*d* and the outlet port 118*b*. The second discharge pipe 120*a* connects the vaporizer outlet pipe 119*c* to the second exhaust pipe 224*b*. A second discharge valve 120*b* is provided at the second discharge pipe 120*a*. The second discharge valve 120*b* is capable of turning on and off the flow of gas flowing from the vaporizer outlet pipe 119*c* to the second exhaust pipe 224*b*. The second gas discharge system is constituted by at least the second discharge pipe 120*a* and the second discharge valve 120*b*.

A detour path 120*c* is capable of supplying the gas from the vaporizer 118 to one of the first gas supply pipe 113*a* and the second discharge pipe 120*a*. The detour path 120*c* is constituted by the second discharge valve 120*b* and the outlet valve 119*d*. The detour path 120*c* may be embodied by a single valve such as a three-way valve.

The second exhaust pipe 224*b* is connected to the first exhaust pipe 224*a*. A gas exhausted into the second exhaust pipe 224*b* is exhausted by the second vacuum pump 223*b* via the first exhaust pipe 224*a*.

Accordingly, the gas present in the first gas supply pipe 113*a*, the vaporizer 118, the vaporizer inlet pipe 119*a* and the vaporizer outlet pipe 119*c* can be discharged via the second discharge pipe 120*a*, the first discharge pipe 113*h* or both to the second exhaust pipe 224*b*.

<Second Gas Supply System>

A second supply source 123, a mass flow controller (MFC) 125 and a valve 126 are provided at the second gas supply pipe 123*a* in order from an upstream side to a downstream side of the second gas supply pipe 123*a*. The valve 126 may also be referred to as "second timing valve 126" for controlling the timing of the supply of the second gas onto the substrate 100.

The second element-containing gas (second gas) is supplied to the substrate processing apparatus 200 via the MFC 125 and the valve 126 provided at the second gas supply pipe 123*a* and the common gas supply pipe 242.

According to the embodiment, the second element-containing gas (second gas) is one of the process gases. The second element-containing gas includes a gas containing nitrogen (N) such as ammonia ($NH_3$) gas and a mixture of hydrogen ($H_2$) gas and nitrogen ($N_2$) gas A remote plasma unit (RPU) 180 may be provided at the second gas supply pipe 123*a*. The remote plasma unit 180 is capable of activating the second gas.

The second gas supply system is constituted by the second gas supply pipe 123*a*, the MFC 125 and the valve 126.

The second gas supply system may further include the second supply source 123, the RPU 180 or both.

<Third Gas Supply System (Inert Gas Supply System)>

A third supply source 133, a mass flow controller (MFC) 135 and a valve 136 are provided at the third gas supply pipe 133*a* in order from an upstream side to a downstream side of the third gas supply pipe 133*a*. The valve 136 may also be referred to as "third timing valve 136" for controlling the timing of the supply of the third gas onto the substrate 100.

The inert gas is supplied as the third gas to the shower head 234 via the MFC 135 and the valve 136 provided at the third gas supply pipe 133*a* and the common gas supply pipe 242.

The inert gas is unlikely to react with the first gas. The inert gas includes, for example, nitrogen ($N_2$) gas, argon (Ar) gas and helium (He) gas.

The third gas supply system (inert gas supply system) is constituted by the third gas supply pipe 133*a*, the MFC 135 and the valve 136.

According to the embodiment, the MFCs, the valves, the vaporizer and the RPU constituting the first gas supply system, the second gas supply system and the third gas supply system communicate with the controller 260 to transmit and receive the data described below:

MFCS: data representing the flow rates;

Valves: data representing the opening degree of the valves;

Vaporizer: data representing the amount of vaporization; and

RPU: data representing the amount of electrical power.

<Controller>

As shown in FIG. 1, the substrate processing apparatus 200 includes the controller 260 configured to control the operation of components of the substrate processing apparatus 200.

Figure 3:
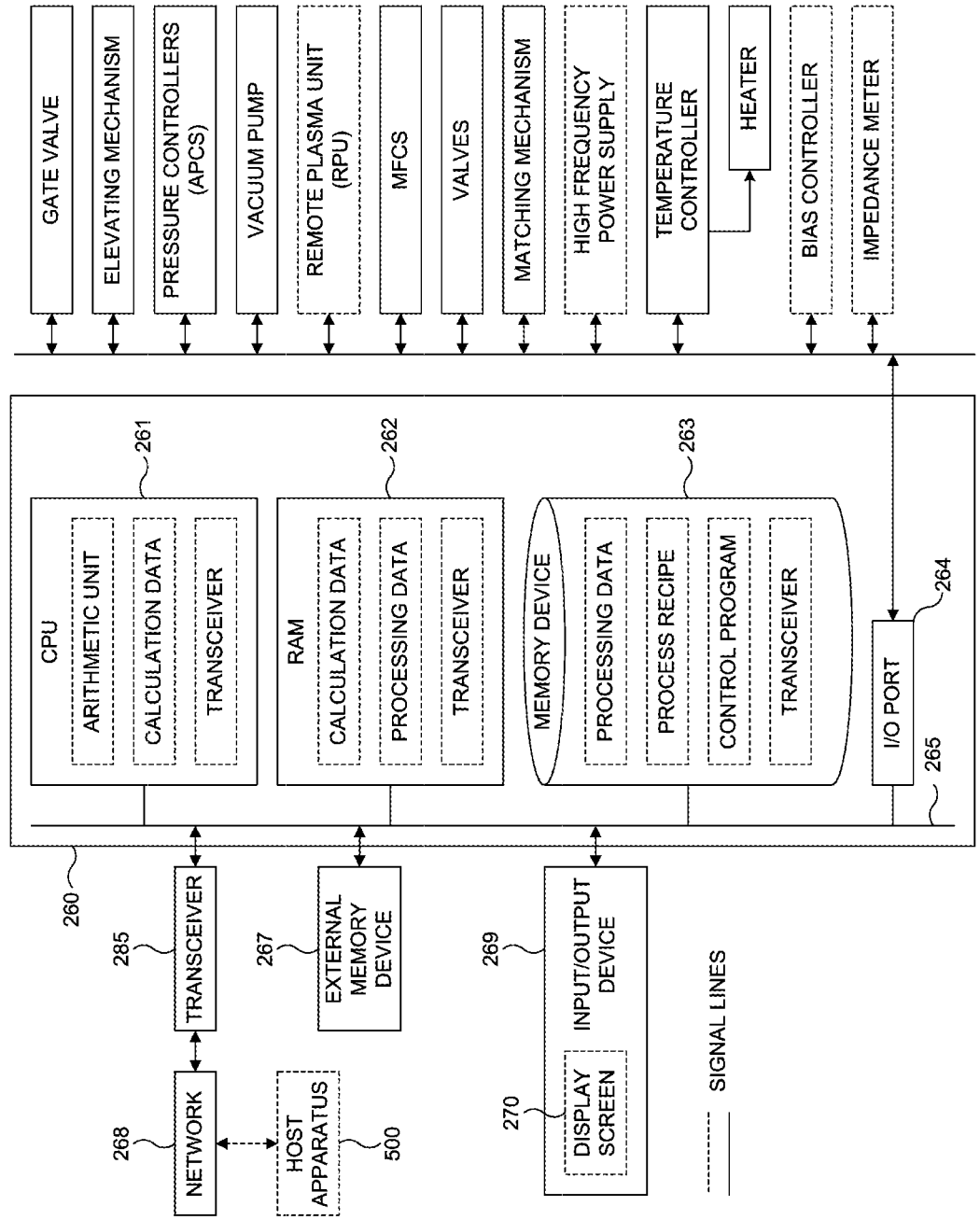
FIG. 3 is a block diagram schematically illustrating a configuration of a controller and components controlled by the controller of the substrate processing apparatus preferably used in the embodiment.

FIG. 3 is a block diagram schematically illustrating a configuration of the controller 260 and components connected to the controller 260 such as a network 268 and a host apparatus 500. The controller 260, which is a control device, may be embodied by a computer having a CPU (Central Processing Unit) 261, a RAM (Random Access Memory) 262, a memory device 263 and an I/O port 264. The RAM 262, the memory device 263 and the I/O port 264 may exchange data with the CPU 261 via an internal bus 265. An input/output device 269 such as a touch panel, an external memory device 267 and a transceiver 285 may be additionally connected to the controller 260. The input/output device 269 may further include a display 270 configured to display the status of the substrate processing apparatus and the data received from the host apparatus.

The memory device 263 may be embodied by components such as flash memory and HDD (Hard Disk Drive). A control program for controlling the operation of the substrate processing apparatus 200; a process recipe in which information such as the order and the condition of the substrate processing is stored; and calculation data and processing data generated during the processing of the substrate 100 are readably stored in the memory device 263. The process recipe is a program that is executed by the controller 260 to obtain a predetermined result by performing sequences of processes. Hereinafter, the process recipe and the control program may be collectively referred to simply as "program." The term "program" may refer to only the process recipe, only the control program, or both. The RAM 262 is a work area in which the program or the data such as the calculation data and the processing data read by the CPU 261 are temporarily stored.

The I/O port 264 is electrically connected to the components such as the gate valve 1490, the elevating mechanism 218, the temperature controller 400, the pressure controllers 227 and 228, the vacuum pumps 223a and 223b, the matching mechanism 251, the high frequency power supply 252, the MFCs 115, 125 and 135, the valves 116a, 116b, 116h, 119b, 119d, 121a, 126 and 136, and the bias controller 257. The I/O port 264 may be electrically connected to the components such as the impedance meter 254 and the RPU 180. Herein, "electrically connected" means that the components are connected by electrical cables or the components are in communication with one another to transmit and receive data (signals) to and from one another.

The CPU 261, which is an arithmetic unit, is configured to read and execute the control program stored in the memory device 263, and read the process recipe stored in the memory device 263 in accordance with an instruction such as an operation command inputted via the input/output device 269. The CPU 261 is capable of computing the calculation data by comparing a value inputted from the transceiver 285 with the process recipe or control data stored in the memory device 263. The CPU 261 may select the process recipe based on the calculation data. The CPU 261 may be configured to control operation of the substrate processing apparatus 200 according to the process recipe. For example, the CPU 261 may be configured to perform operation, according to the process recipe, such as an opening/closing operation of the gate valve 1490, an elevating/lowering operation of the elevating mechanism 218, an operation of supplying electrical power to the temperature controller 400, an operation of adjusting the temperature of the substrate support 210 by the temperature controller 400, a pressure adjusting operation of the pressure controllers 227 and 228, an ON/OFF control of the vacuum pumps 223a and 223b, gas flow rate adjusting operations of the MFCs 115, 125 and 135, a gas activation operation of the RPU 180, opening/closing operations of the valves 116a, 116b, 116h, 119b, 119d, 121a, 126 and 136, a matching operation of the power of the matching mechanism 251, an operation of controlling the high frequency power supply 252, a control operation of the bias controller 257, and a matching operation of the matching mechanism 251 based on the data measured by the impedance meter 254. A transceiver of the CPU 261 may transmit or receive control data according to the process recipe to or from the components described above to control the operations of the components.

The controller 260 is not limited to a dedicated computer. The controller 260 may be embodied by a general-purpose computer. The controller 260 according to the embodiment may be embodied by preparing the external memory device 267 (e.g., a magnetic tape, a magnetic disk such as a flexible disk and a hard disk, an optical disk such as a CD and a DVD, a magneto-optical disk such as MO, a semiconductor memory such as a USB memory and a memory card), and installing the program onto the general-purpose computer using the external memory device 267. The method of providing the program to the computer is not limited to the external memory device 267. The program may be directly provided to the computer by a communication means such as the transceiver 285 and the network 268 (Internet and a dedicated line) instead of the external memory device 267. The memory device 263 and the external memory device 267 may be embodied by a computer-readable recording medium. Hereafter, the memory device 263 and the external memory device 267 are collectively referred to as recording media. Herein, "recording media" may refer to only the memory device 263, only the external memory device 267, or both.

<Substrate Processing>

Hereinafter, the substrate processing will be described with reference to FIGS. 4 through 7.

Figure 4:
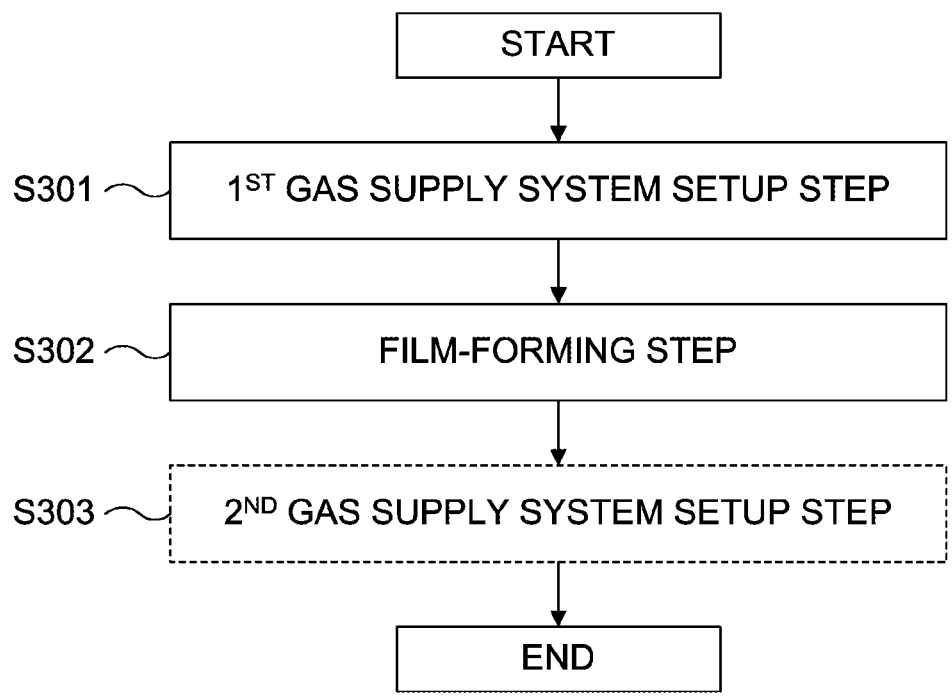
FIG. 4 is a flowchart illustrating a substrate processing according to the embodiment.

As shown in FIG. 4, a gas supply system setup step may be performed before the film-forming step S302, after the film-forming step S302 or both before and after the film-forming step S302. The gas supply system setup step performed before the film-forming step S302 is referred to as "first gas supply system setup step S301", and the gas supply system setup step performed after the film-forming step S302 is referred to as "second gas supply system setup step S303." The first gas supply system setup step S301 will be described in detail with reference to FIG. 5. The second gas supply system setup step S303 is substantially the same as the first gas supply system setup step S301.

<First Gas Supply System Setup step S301>

Figure 5:
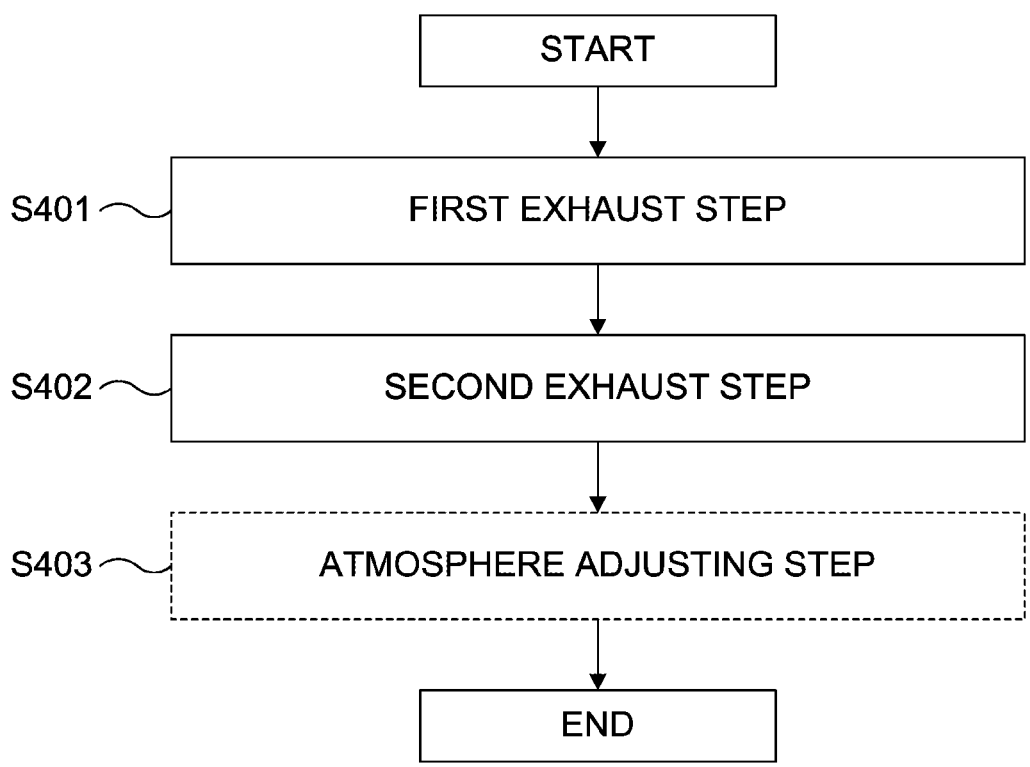
FIG. 5 is a flowchart illustrating a gas supply system setup step according to the embodiment.

As shown in FIG. 5, the first gas supply system setup step S301 includes a first exhaust step (gas supply pipe exhausting step) S401, a second exhaust step (vaporizer exhausting step) S402 and an atmosphere adjusting step S403. Hereinafter, the steps S401 through S403 will be described in detail.

<First Exhaust Step S401 (Gas Supply Pipe Exhausting Step)>

First, the gas supply pipe exhausting step S401 will be described. In the gas supply pipe exhausting step S401, the first gas remaining in the first gas supply pipe 113a is exhausted through the second gas discharge system. Specifically, the valve 116b, the inlet valve 119b and the outlet valve 119d are closed and the purge valve 116a and the first discharge valve 116h are opened. The first gas supply pipe 113a, the purge valve 116a, the first discharge pipe 113h and the first discharge valve 116h form, the gas flow path from the inert gas supply source 113b to the second exhaust pipe 224b. The gas remaining in the first gas supply pipe 113a is exhausted through the second exhaust pipe 224b for a predetermined time duration. Simultaneously, the inert gas is supplied from the inert gas supply source 113b to extrude the gas remaining in the first gas supply pipe 113a. The exhaust of the inner atmosphere of the first gas supply pipe 113a and the supply of the inert gas may be alternately repeated. By exhausting the inner atmosphere of the first gas supply pipe 113a, the amount of the gas remaining in the first gas supply pipe 113a is reduced.

After completing the exhaust of the first gas supply pipe 113a, the gas supply pipe exhausting step S401 is completed by closing the purge valve 116a and the first discharge valve 116h. After closing the purge valve 116a and the first discharge valve 116h, the valve 116b may be opened and the first gas supply pipe 113a may be evacuated to a high vacuum. The valve 116b may be closed thereafter to maintain the inner atmosphere of the first gas supply pipe 113a at a high vacuum.

<Second Exhaust Step S402 (Vaporizer Exhausting Step)>

Next, the vaporizer exhausting step S402 will be described. In the vaporizer exhausting step S402, the natural first gas, etc. in the space 118c of the vaporizer 118 is exhausted from the vaporizer 118 through the first gas discharge system and the second exhaust pipe 224b. Specifically, the inlet valve 119b and the second discharge valve 120b are opened and the purge valve 116a, the outlet valve 119d and the first discharge valve 116h are closed. With the inlet valve 119b and the second discharge valve 120b open and the purge valve 116a, the outlet valve 119d and the first discharge valve 116h closed, the inner atmosphere, of the vaporizer 118 is exhausted through the second discharge pipe 120a and the second exhaust pipe 224b. In addition to vacuum-exhausting the vaporizer 118, the inert gas supply source 113b may supply an inert gas to the vaporizer 118 to extrude the natural first gas, etc. in the vaporizer 118. The vacuum-exhaust of the inner atmosphere of the vaporizer 118 and the supply of the inert gas may be alternately repeated to reduce the amount of the natural first gas, etc. present in the vaporizer 118.

The time duration of the exhaust of the vaporizer 118 and the flow rate of the inert gas are determined depending upon the data such as the amount of the source remaining in the vaporizer 118, the idling time of the substrate processing apparatus 200, the idling time of the vaporizer 118 and accumulated time duration of the film-forming step S302. For example, when the amount of the remaining source is small, it may be determined that the space 118c is large and the amount of the natural first gas, etc. in the space 118c is also large, thereby increasing the time duration of the exhaust of the vaporizer 118. That is, the amount of the natural first gas, etc. is proportional to the time duration of the exhaust of the vaporizer 118. The time duration of the exhaust of the vaporizer 118 or the flow rate of the inert gas may be increased according to the proportional relationship.

After exhausting the vaporizer 118 for a predetermined time, the vaporizer exhausting step S402 is terminated by closing the second discharge valve 120b.

<Atmosphere Adjusting Step S403>

Next, the atmosphere adjusting step S403 will be described. In the atmosphere adjusting step S403, the inlet valve 119b is opened and the inert gas is supplied to the vaporizer 118 to fill the space 118c with the first gas by the evaporation of the source. After a predetermined time elapses, the outlet valve 119d is opened and the first gas is supplied into the first gas supply pipe 113a to fill the first gas supply pipe 113a with the first gas.

In the vaporizer exhausting step S402, when the first gas supply pipe 113a is in a high vacuum state, the first gas can be supplied from the vaporizer 118 to the first gas supply pipe 113a without stopping. Accordingly, the dilution of the first gas in the first gas supply pipe 113a may be suppressed such that the difference in the concentration of the gas supplied to the substrate processing apparatus 200 for the first time after the first gas supply system setup step S301 and the concentration of the gas supplied to the substrate processing apparatus 200 after the film-forming step S302 is performed at least once is reduced. As a result, the uniformity of the substrate processing is improved.

The first gas supply system setup step S301 is performed as described above.

Figure 6:
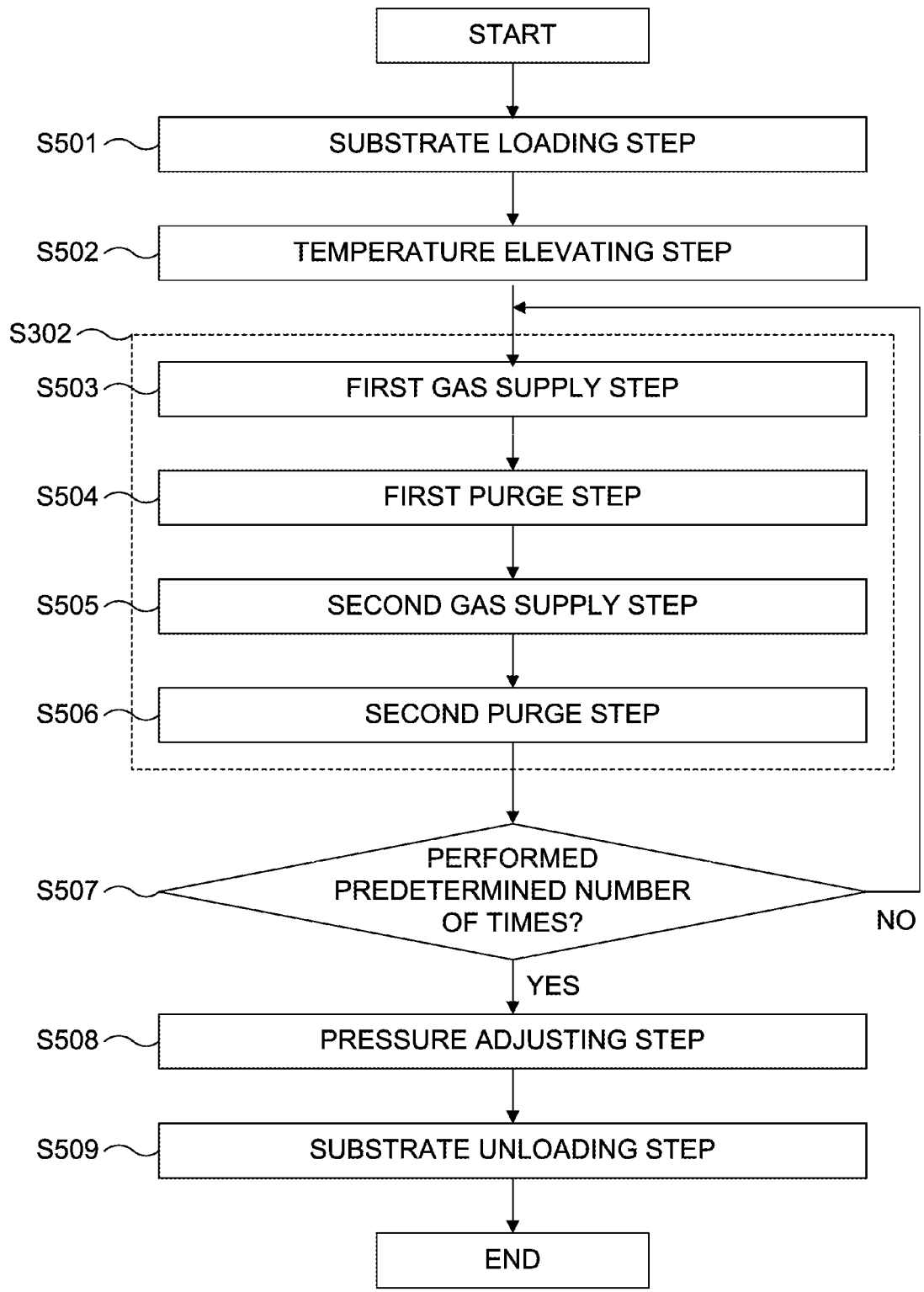
FIG. 6 is a flowchart illustrating a film-forming step and steps performed before and after the film-forming step according to the embodiment.

Hereinafter, the film-forming step S302 and steps performed before and after the film-forming step S302 will be described with reference to FIG. 6.

<Substrate Loading Step S501>

The substrate loading step S501 and the temperature elevating step S502 are performed before performing the film-forming step S302. In the substrate loading step S501, the substrate 100 is loaded into the process space 201. Specifically, the substrate support 210 is lowered by the elevating mechanism 218 until the lift pins 207 protrude from the upper surface of the substrate support 210 through the holes 214. After the inner pressure of the process chamber 201 or the inner pressure of the transfer chamber 203 is adjusted to a predetermined pressure, the gate valve 1490 is opened. The substrate 100 is transferred through the gate valve 1490 and placed on the lift pins 207, and the gate valve 1490 is then closed. By elevating the substrate support 210 to a predetermined position by the elevating mechanism 218, the substrate 100 is transferred from the lift pins 207 to the substrate support 210. Next, the process space 201 may be exhausted via the first exhaust pipe 224a, the second exhaust port 1481 or both until the inner pressure of the process space 201 reaches a predetermined level (vacuum level). Simultaneously, the opening degree of the pressure controller 227, the opening degree of the pressure controller 228 or both may be feedback-controlled based on the pressure measured by the pressure sensor (not shown).

<Temperature Elevating Step S502>

In the temperature elevating step S502, the temperature of the substrate 100 is elevated to a predetermined temperature while the substrate 100 is supported by the substrate support 210. After the temperature of the substrate 100 reaches the predetermined temperature, the film-forming step S302 is performed.

In the temperature elevating step S502, the temperature of the heater 213 ranges from 100° C. to 700° C., preferably from 300° C. to 500° C. The temperature of the heater 213 is controlled such that the temperature of the substrate 100 is maintained at the predetermined temperature during at least the film-forming step S302. Specifically, the power supplied to the heater 213 is feedback-controlled based on the temperature detected by a temperature sensor (not shown) to maintain the substrate support 210 at the predetermined temperature.

Figure 7:
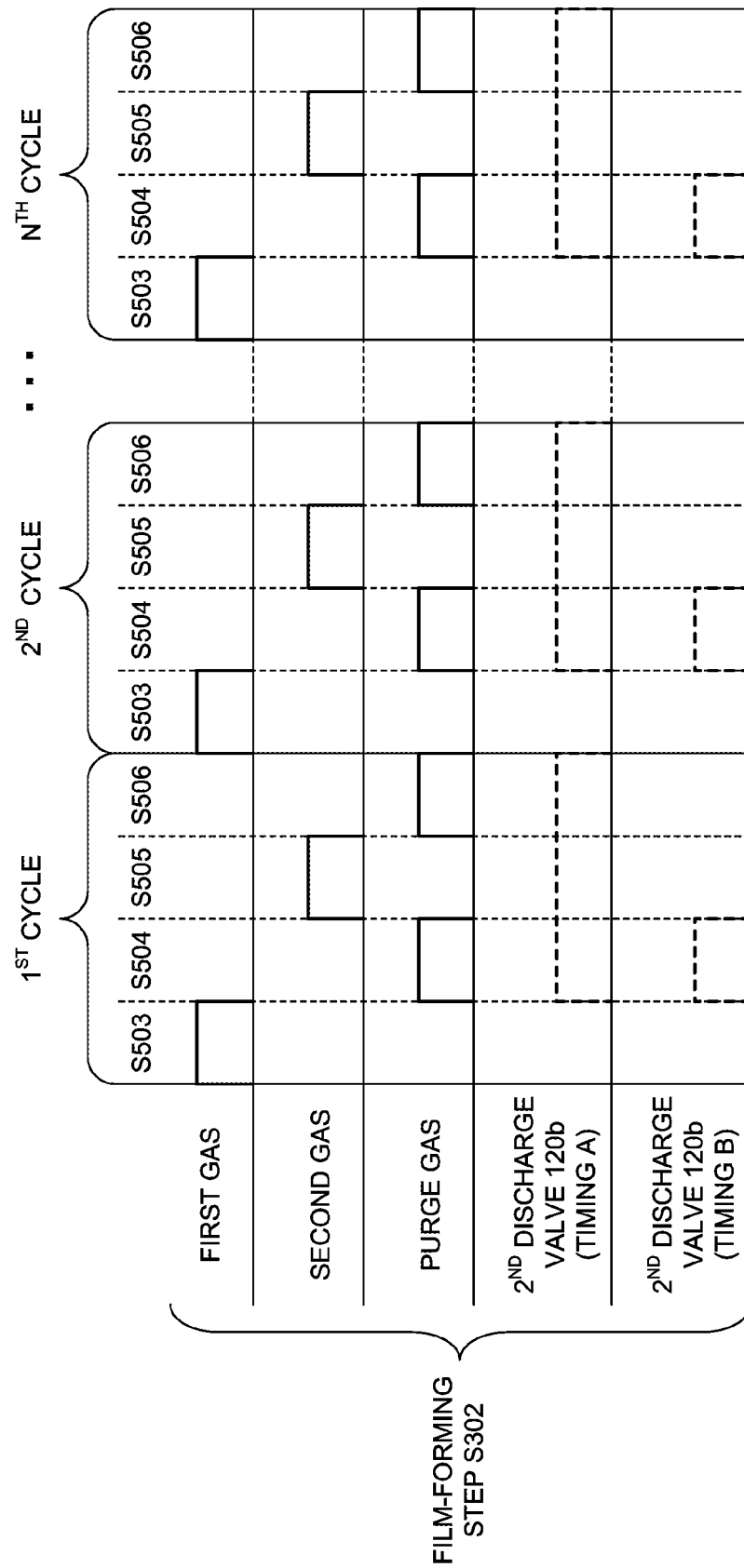
FIG. 7 is timing diagram exemplifying a timing of a gas supply and a second discharge valve during the film-forming step according to the embodiment.

Hereinafter, the film-forming step S302 will be described with reference to FIGS. 6 and 7.

<Film-Forming Step S302>

The film-forming step S302 includes a first gas supply step S503, a first purge step S504, a second gas supply step S505 and a second purge step S506, which will be described later. While the film-forming step S302 will be described by way of an example wherein the first gas supply step S503, the first purge step S504, the second gas supply step S505 and the second purge step S506 are performed sequentially, the first gas supply step S503 and the second gas supply step S505 may be performed simultaneously in part. When the first gas supply step S503 and the second gas supply step S505 are performed simultaneously in part, the first purge step S504 and the second purge step S506 may be performed simultaneously or one of the first purge step S504 and the second purge step S506 may be omitted.

<First Gas Supply Step S503>

In the first gas supply step S503, a silicon-containing gas serving as the first gas (the first process gas) is supplied into the process chamber 201 by the first gas supply system. Specifically, BDEAS gas is supplied as the silicon-containing gas. Specifically, With the first timing valve 116b, the outlet valve 119d and the inlet valve 119b open and the purge valve 116a, the second discharge valve 120b and the first discharge valve 116h closed, the inert gas having the flow rate thereof adjusted by the MFC 115 is supplied from the inert gas supply source 113b to the vaporizer 118 such that the BDEAS gas is supplied from the vaporizer 118 to the substrate processing apparatus 200. Specifically, the BDEAS gas is supplied to the depressurized process chamber 201 via the buffer chamber 232 and the holes 234a of the shower head 234. The exhaust system continuously exhausts the process chamber 201 such that the inner pressure, of the process chamber 201 is maintained at a predetermined pressure. With the inner pressure of the process chamber 201 is maintained at the predetermined pressure, the BDEAS gas is supplied to the substrate 100 in the process chamber 201 at a first pressure preferably ranging from 10 Pa to 1000 Pa. As a result, a silicon-containing layer is formed on the substrate 100.

<First Purge Step S504>

After the silicon-containing layer is formed on the substrate 100, the first timing valve 116b is closed to stop the supply of the BDEAS gas. The first purge step S504 is performed by stopping the supply of the BDEAS gas and exhausting the first gas present in the process chamber 201 or the process gas present in the buffer chamber 232 by the first exhaust system.

In the first purge step S504, the remaining gas may be extruded by further supplying a purge gas such as an inert gas from the inert gas supply source 113b in addition to vacuum-exhausting the gas. In order to supply the inert gas, the valve 136 is opened and the flow rate of the inert gas is adjusted by the MFC 135. The vacuum exhaust may be combined with the supply of the inert gas. Alternatively, the vacuum exhaust and the supply of the inert gas may alternately be performed.

After a predetermined time elapses, the supply of the inert gas is stopped by closing the valve 136. However, the inert gas may be continuously supplied by maintaining the valve 136 open.

<Second Gas Supply Step S505>

After the first purge step S504 is performed, ammonia ($NH_3$) gas, which is the second gas (also referred to as second process gas or a reactive gas), is supplied into the process chamber 201 by the second gas supply system. Specifically, the valve 126 is opened and the $NH_3$ gas is supplied into the process chamber 201 via the gas introduction port 241, the buffer chamber 232 and the holes 234a.

In the second gas supply step S505, the flow rate of the $NH_3$ gas is adjusted by the MFC 125 to a predetermined value. For example, the flow rate of $NH_3$ gas may range from 1 sccm to 10000 sccm.

As the $NH_3$ gas is supplied to the silicon-containing layer formed on the substrate 100, the silicon-containing layer is modified into a silicon nitride (SiN) layer having a predetermined thickness. Specifically, the silicon nitride layer is formed on the substrate 100 by reducing carbon (C) or hydrogen (H) in the silicon-containing layer.

<Second Purge Step S506>

The second purge step S506 substantially the same as the first purge step S504 is performed. For example, the supply of the second gas is stopped and the second gas present in the process chamber 201 or the second gas present in the buffer chamber 232 is exhausted by the exhaust system. Purge may be performed by supplying the purge gas into the buffer chamber 232 and the process chamber 201.

The second discharge valve 120b may be opened in at least one of the first purge step S504, the second gas supply step S505 and the second purge step S506. For example, the second discharge valve 120b may be opened during the first purge step S504, the second gas supply step S505 and the second purge step S506 denoted as "TIMING A" of FIG. 7. The natural first gas, etc. in the vaporizer 118 are removed from the vaporizer 118 into to the second discharge pipe 120a by opening the second discharge valve 120b such that the inner pressure of the vaporizer 118 and the ratio of the first gas to the inert gas in the vaporizer 118 are maintained constant. As a result, the concentration of the first gas supplied to the substrate 100 is maintained constant and the quality of a plurality of atomic layers contained in the film formed on the substrate 100 is preserved.

When the outlet valve 119d is closed as the second discharge valve 120b is opened, the pressure drop in the first gas supply pipe 113a can be suppressed, and the natural first gas, etc. may be prevented from entering the first gas supply pipe 113a.

In the presence of a gas tank 181, the opening timing of the second discharge valve 120b may be adjusted such that the second discharge valve 120b is opened after a predetermined amount of the first gas is stored in the gas tank 181. For example, after the start of the step S503 of the first cycle and before the start of the step S503 of the second cycle, the second discharge valve 120b may be opened for a time period such that there is a sufficient time to fill the gas tank 181 with the predetermined amount of the first gas necessary. Specifically, the second discharge valve 120b is opened during the first purge step S504 to discharge the natural first gas, etc., and the second discharge valve 120b is then closed during the steps S505 and S506 to fill the gas tank 181 with the first gas, which is denoted as "TIMING B" of FIG. 7. As a result, the natural first gas, etc. is prevented from flowing into the gas tank 181.

<Determination Step S507>

After the second purge step S506 is complete, the controller 260 determines whether a cycle (the film-forming step S302) including the steps S503 through S506 is performed a predetermined number of times (n times). That is, the controller 260 determines whether the SiN layer formed on the substrate 100 has a desired thickness which may be may be obtained by performing the cycle including the step S503 through the step S506 at least once.

When the controller 260 determines, in the determination step S507, that the cycle is not performed the predetermined number of times ("NO" in FIG. 6), the film-forming step S302 is performed again. When the controller 260 determines, in the determination step S507, that the cycle is performed the predetermined number of times ("YES" in FIG. 6), the film-forming step S302 is terminated and the pressure adjusting step S508 is then performed.

<Pressure Adjusting Step S508>

Hereinafter, the pressure adjusting step S508 will be described. In the pressure adjusting step S508, the process chamber 201 or the transfer chamber 203 is via the first exhaust port 221, the second exhaust port 1481 or both until the inner pressure of the process chamber 201 or the inner pressure of the transfer chamber 203 reaches a predetermined level (vacuum level).

<Substrate Unloading Step S509>

After the inner pressure of the process chamber 201 or the inner pressure of the transfer chamber 203 is adjusted to the predetermined level in the pressure adjusting step S508, the substrate support 210 is lowered by the elevating mechanism 218 until the lift pins 207 protrude from the upper surface of the substrate support 210 through the holes 214, thereby supporting the substrate 100 with the lift pins 207. Thereafter, the gate valve 1490 is opened, and the substrate 100 is unloaded from the transfer chamber 203 into the vacuum transfer chamber (not shown).

<Second Gas Supply System Setup step S303>

After the film-forming step S302 is complete, the second gas supply system setup step S303 may be performed. Since the second gas supply system setup step S303 is substantially the same as the first gas supply system setup step S301, a detailed description thereof is omitted.

The substrate processing according to the embodiment is performed as described above.

While the technique is described in detail by way of the embodiment, the above-described technique is not limited thereto. The above-described technique may be modified in various ways without departing from the gist thereof.

For example, the above-described technique may be applied to other processes as well as the film-forming process exemplified above. That is, the above-described technique may also be applied to diffusion process, oxidation process, nitridation process, oxynitridation process, reduction process, oxidation-reduction process, etching process and thermal process using plasma. The above-described technique may also be applied to plasma oxidation or plasma nitridation of a substrate or a film formed on the substrate using only reactive gas. The above-described technique may also be applied to the plasma annealing process using only reaction gas.

While the manufacturing process of a semiconductor device is exemplified above, the above-described technique may be applied to other manufacturing processes. For example, the above-described technique may be applied to a manufacturing process of a liquid crystal device, a manufacturing process of a solar cell, a manufacturing process of a light emitting device, a manufacturing process of a glass substrate, a manufacturing process of a ceramic substrate and a manufacturing process of a conductive substrate.

While the embodiment wherein a silicon nitride film is formed is described above, the above-described technique may be applied to the formations of other films using different gases. For example, the above-described technique may also be applied to formations of an oxygen-containing film, a nitrogen-containing film, a carbon-containing film, a boron-containing film, a metal-containing film and combinations thereof. The above-described technique may also be applied to formations of AlO film, ZrO film, HfO film, HfAlO film, ZrAlO film, SiC film, SiCN film, SiBN film, TiN film, TiC film and TiAlC film.

While a substrate processing apparatus capable of processing one substrate in one process chamber is exemplified above, the above-described technique is not limited thereto. The above-described technique may be applied to other substrate processing apparatuses. For example, the above-described technique may also be applied to a substrate processing apparatus capable of processing a plurality of substrates arranged horizontally or vertically.

According to the technique described herein, a quality of a film formed on a substrate is improved

What is claimed is:

1. A method of manufacturing a semiconductor device, comprising:
   (a) exhausting an inner atmosphere of a first gas supply pipe configured to supply a first gas generated by a vaporizer to a process chamber capable of accommodating a substrate by a first gas discharge system connected to the first gas supply pipe;
   (b) exhausting an inner atmosphere of the vaporizer through a second gas discharge system provided at a vaporizer outlet pipe of the vaporizer by supplying an inert gas to the vaporizer via a vaporizer inlet pipe of the vaporizer; and
   (c) supplying the first gas generated by the vaporizer to the process chamber without the substrate accommodated therein via the vaporizer outlet pipe, the first gas supply pipe and a first timing valve provided at the first gas supply pipe before or after performing (a) and (b),
   wherein the inner atmosphere of the vaporizer is exhausted through a second discharge pipe of the second gas discharge system and a second discharge valve provided at the second discharge pipe in (b), and opening or closing of the second discharge valve is controlled based on an amount of source in the vaporizer, an idling time of the vaporizer, or both,
   wherein the amount of the source in the vaporizer is detected based on at least one of a level of a liquid source in the vaporizer, a weight of the source in the vaporizer, an accumulated amount of a flow rate of the inert gas, and an accumulated time duration of the first timing valve in open state.

2. The method of claim 1, wherein (b) is performed after (a) is performed.

3. The method of claim 2, wherein the inner atmosphere of the first gas supply pipe is vacuum-exhausted in (a) with an outlet valve provided at the vaporizer outlet pipe closed, and (c) is performed after (b) is performed.

4. The method of claim 3, wherein the outlet valve provided at the vaporizer outlet pipe is opened as the second discharge valve is closed, and the second discharge valve is opened as the outlet valve is closed.

5. The method of claim 2, wherein an outlet valve provided at the vaporizer outlet pipe is opened as the second discharge valve is closed, and the second discharge valve is opened as the outlet valve is closed.

6. The method of claim 1, wherein the inner atmosphere of the first gas supply pipe is exhausted in (a) by supplying an inert gas into the first gas supply pipe via a purge valve provided at the first gas supply pipe.

7. The method of claim 6, wherein the inner atmosphere of the first gas supply pipe is vacuum-exhausted in (a) with an outlet valve provided at the vaporizer outlet pipe closed, and (c) is performed after (b) is performed.

8. The method of claim 1, wherein the inner atmosphere of the first gas supply pipe is vacuum-exhausted in (a) with an outlet valve provided at the vaporizer outlet pipe closed, and (c) is performed after (b) is performed.

9. The method of claim 8, wherein the outlet valve provided at the vaporizer outlet pipe is opened as the second discharge valve is closed, and the second discharge valve is opened as the outlet valve is closed.

10. The method of claim 1, wherein an outlet valve provided at the vaporizer outlet pipe is opened as the second discharge valve is closed, and the second discharge valve is opened as the outlet valve is closed.

11. The method of claim 1, wherein the amount of the source in the vaporizer is detected based on a level of a liquid source in the vaporizer.

12. The method of claim 1, wherein the amount of the source in the vaporizer is detected based on a weight of the source in the vaporizer.

13. The method of claim 1, wherein the amount of the source in the vaporizer is detected based on an accumulated amount of a flow rate of the inert gas.

14. The method of claim 1, wherein the amount of the source in the vaporizer is detected based on an accumulated time duration of the first timing valve in open state.

15. The method of claim 1, further comprising:
   (d) loading the substrate into the process chamber and processing the substrate in the process chamber after (a), (b) and (c) are performed.

* * * * *